United States Patent [19]
Kuehlmann et al.

[11] Patent Number: 6,035,107
[45] Date of Patent: Mar. 7, 2000

[54] METHOD FOR PERFORMING FUNCTIONAL COMPARISON OF COMBINATIONAL CIRCUITS

[75] Inventors: Andreas Kuehlmann, Poughkeepsie; Florian Karl Krohm, Millbrook, both of N.Y.

[73] Assignee: International Bunsiness Machines Corporation, Armonk, N.Y.

[21] Appl. No.: 08/919,736

[22] Filed: Aug. 28, 1997

[51] Int. Cl.⁷ ........................................................ G06F 17/50
[52] U.S. Cl. ................................ 395/500.02; 395/500.19
[58] Field of Search ........................... 395/500.02, 500.19

[56] References Cited

U.S. PATENT DOCUMENTS

| | | | |
|---|---|---|---|
| 5,649,165 | 7/1997 | Jain et al. | 395/500 |
| 5,754,454 | 5/1998 | Pixley et al. | 364/580 |

OTHER PUBLICATIONS

Mukherjec et al.: "Efficient Combinational Verification Using BDDs and a Hash Table"; 1997 IEEE Int. Symp. Circuits and Systems, pp. 1025–1028, Jun. 1997.

*Primary Examiner*—Kevin J. Teska
*Assistant Examiner*—Hugh Jones
*Attorney, Agent, or Firm*—F. Chau & Associates, LLP

[57] ABSTRACT

A verification technique which is specifically adapted for formally comparing large combinational circuits with some structural similarities. The approach combines the application of Binary Decision Diagrams (BDDs) with circuit graph hashing, automatic insertion of multiple cut frontiers, and a controlled elimination of false negative verification results caused by the cuts. Multiple BDDs are computed for the internal nets of the circuit, originating from the cut frontiers, and the BDD propagation is prioritized by size and discontinued once a given limit is exceeded. The resulting verification engine is reliably accurate and efficient for a wide variety of practical hardware designs ranging from identical circuits to designs with very few similarities.

20 Claims, 2 Drawing Sheets

METHOD FOR PERFORMING FUNCTIONAL COMPARISON OF COMBINATIONAL CIRCUITS

BACKGROUND OF THE INVENTION

1. Field of the Invention

The present invention relates to the comparison of combinational circuits. More specifically, it relates to a method of comparing combinational circuits using Binary Decision Diagrams (BDDs), circuit graph hashing, cutpoint guessing, and false negative elimination.

2. Prior Art

In recent years, formal techniques for verifying properties of complex systems have become widely accepted in practical design methodologies. The computational complexity of the corresponding algorithms results in a fundamental trade-off between the generality of the verification model and the size of the designs that can be handled in practice. For example, verifying complex temporal properties using model checking is relatively expensive and often not scalable to designs with a large number of storage elements. Conversely, a combinational verification model significantly limits the expressiveness of the properties to be verified, but is practically applicable to large designs. Today, combinational models are commonly used to prove the functional equivalence of two design representations modeled on different levels of abstraction. The matching state encoding of the two models is enforced by the overall design methodology.

Most approaches to combinational circuit verification can be classified into two fundamental categories. The first category is based on functional implications computed directly on the circuit structure by applying algorithms for test pattern generation (ATPG) or recursive learning. The goal of these approaches is to prove that the XOR function between the two compared outputs cannot be justified to a logical "1". Starting at the primary inputs, the two circuits are successively merged, which typically simplifies the proof. The main problem with structure based approaches such as these, is the potentially large effort required to compute equivalence implications especially for circuits with no fine grain similarity. The search to find a pair of identical nets, which are further away from the primary inputs, can be very expensive.

The second category of approaches to combinational verification is based on canonical representations of Boolean functions, typically binary decision diagrams (BDDs) or their derivatives. The functions of the two circuits to be compared are converted into canonical forms which are then structurally compared. The major advantage of BDDs is their efficiency for a wide variety of practically relevant combinational circuits. If the BDD size does not grow too large, this type of Boolean reasoning is fast and independent of the actual circuit structure. Moreover, if structural similarities of the two designs are exploited, BDDs can effectively find equivalence implications between nets even if they are farther away from the primary inputs.

The primary problem with BDDs is their exponential memory complexity. If the BDD structure grows too large, their storage and manipulation effort becomes very expensive. Various approaches have been proposed to reduce the complexity of BDD-based equivalence checking by exploiting structural similarities. These techniques have been successful because a large majority of industrial designs contain many intermediate functions that occur in the specification and in the implementation. These nets can be used as cutpoints to partition a complex equivalence check into a set of smaller, simpler comparisons.

Most cutpoint-based verification methods consist of three phases. First, a set of potential cutpoints is identified by using random simulation, ATPG techniques, or BDDs. From these candidates the final cutpoints are chosen by specific selection criteria which are typically difficult to tune to a wider set of applications. Second, the overall verification task is partitioned along these cutpoints into a set of smaller verification problems which are solved independently. And third, in case of mis-compares, false negatives due to functional constraints at the partition boundaries are eliminated.

There are basically three methods to handle false negatives, all of which have fundamental limitations. The first method is based on resubstitution of the cutpoint variables by their incoming functions using the BDD compose operation. This method is extremely sensitive to the order in which the cutpoints are handled. In the worst case, a bad order might cause the elimination of all cutpoints including the ones which do not cause false negatives. Practically, the problem becomes more significant with more cutpoints since the likelihood of false negatives increases. This causes a dilemma for selecting the right number of cutpoints in that choosing too few results in a blow up of the forward BDD construction (i.e., exponential increase in memory demand), and choosing too many leads to an explosion of the resubstitution.

The second method for handling false negatives is based on cut frontiers, defined by the topological order of the cutpoints in the two networks. False negatives are eliminated by successively applying the image of the previous cut frontier to constrain the miscompare function of the current cut frontier. This method is basically identical to the backward traversal technique for sequential FSM verification and therefore has similar limitations (i.e, the size of the BDD representation of the image tends to blow up in many practical cases).

The third method for eliminating false negatives is based on ATPG techniques to disprove each counter example individually. Here the complexity has shifted into the time domain which makes the approach impractical if the set of miscomparing patterns is large. In addition, if the cutpoints are farther away from the primary inputs and no other functional implications between the two circuits are known, this technique might timeout even on individual counter examples.

SUMMARY OF THE INVENTION

This present invention provides a verification technique or method for comparing large combinational circuits, which utilizes Binary Decision Diagrams (BDDs), circuit graph hashing, cutpoint guessing, and false negative elimination. According to the invention, the processing of BDDs is prioritized by their size and limited to an upper bound (i.e., memory limit) which avoids expensive and often unsuccessful attempts to verify intractable problems. Secondly, the BDD construction is not stopped at cutpoints. Instead, the cutpoint variables start additional BDD frontiers, resulting in multiple, overlapping BDD layers. These layers can be viewed as "several irons in the fire", each of which might succeed in solving the verification problems. In case of false negatives, the BDD layers provide multiple candidates for the elimination process. Similar to the BDD construction, the resubstitution of cutpoint variables is prioritized by size and discontinued once a given limit is exceeded.

The resulting verification engine works well for a wide variety of practical circuits. If the number of cutpoints found in the two functions to be compared is insufficient to verify them successfully, the runtime or memory usage will not grow out of control. Since the BDD processing is controlled by the memory size limit, it will stop and the problem can be passed to another verification engine, (e.g. one based on permissible functions). Furthermore, if the two functions are not equivalent, the presented method will fail to prove it since this generally requires the resubstitution of all cutpoint variables. Instead, the problem is also forwarded to an engine which is specialized in identifying miscomparing functions (e.g. random simulation).

Similar to a BDD package, the verification technique of the present invention is implemented as a Boolean reasoning engine providing operations for Boolean function manipulation and comparison. A non-canonical circuit graph structure is used to store and manipulate functions. During the construction phase, all Boolean operations are mapped onto two-input AND gates (represented by vertices) and INVERTERS (represented by edge attributes). Comparable to the unique table in implementations of BDD packages, a hash table is applied to uniquely identify and merge structurally equivalent parts of the circuit graph.

A request for comparing two Boolean functions is handled in several phases. The overall goal is to merge the two corresponding subgraphs such that both functions are represented by the same vertex. If this is not achieved, it is generally undecidable whether the merging failed due to resource limitations or functional miscomparison. Therefore, the comparison remains undecided and the problem is forwarded to the next verification engine. The algorithm employed to merge two subgraphs can be summarized as follows:

To identify functionally identical vertices of the circuit graph which are not found by hashing, BDDs are computed starting at the primary inputs. Contrary to traditional BDD processing based on depth-first or breadth-first traversal, a sorted heap similar to event heaps of event-driven simulators is used to control the propagation of the BDDs. If during propagation, the BDD size exceeds a given limit, its processing is cancelled.

Identification is performed by using cross-references between BDD nodes and the corresponding circuit graph vertices. Thus, subgraphs with identical functions can easily be identified. If found, functionally equivalent vertices are merged and the subsequent part of the circuit graph is rehashed. The merged vertices are marked as potential cutpoints for the next phase.

If the BDD propagation stops due to exceeding the size limit, and the two outputs have not been proven identical, any previously merged vertices are used as cutpoints to inject new BDD variables onto the heap. The cutpoints are levelized according to their topological depths. All cutpoints at a given level establish a cut frontier which initiates another layer of BDD construction throughout the circuit graph.

After processing of all cut-frontiers, the resulting BDDs at the output vertices are checked for false negatives. Similar to the forward propagation, this step uses a heap to resubstitute the BDDs with the smallest size first. If all cutpoint variables are composed or all resulting BDDs exceed the given size limit, the process stops and the verification problem remains unsolved.

There are few novel aspects which ensure the effectiveness of the technique according to the invention for a wide variety of practical applications. First, using AND/INVERTER structures as a base system to represent Boolean functions in conjunction with vertex hashing, results in a very efficient verification engine for circuits which are structurally identical except for changes caused by simple technology mapping steps. This kind of functional comparison is frequently needed to verify trivial post-synthesis transformations such as scan-path insertion, buffer optimizations, etc. Second, the chosen prioritized BDD processing implements a propagation scheme which follows the size of the BDDs in the two circuits. This ensures that functionally identical vertices are found as early as possible, avoiding the processing of unnecessary BDDs. Third, after two vertices are identified as functionally identical, the merging of the subsequent parts of the circuit graph by rehashing can often be processed all the way to the outputs. This effectively saves the construction of BDDs for several levels in the graph. And last, since the propagation is not stopped at the cuts, the BDD layers generally overlap significantly, which considerably reduces the likelihood of false negatives.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE PREFERRED EMBODIMENTS

Generally, verifying functional equivalence of two circuits is performed in two steps. First, a circuit model is constructed based on primitive Boolean operations and then the actual comparison is performed on that model. In the technique according to the invention, a circuit graph is built by converting all Boolean operations into a structure using two-input AND gates and inverters. During the graph construction, each vertex is entered into a hash table using the vertices of the two input operands and their polarities as key. Since identical vertex keys are a sufficient condition for structural equivalence, the hash table can be used during graph construction to map isomorphic parts of the two circuits onto the same subgraph. The algorithm for equivalence checking is as follows:

```
Algorithm Check_Equivalence (v_1, v_2) {
    if (v_1 == v_2)         return equal;
    if (v_1 == NOT(v_2))    return not_equal;
    for all primary inputs i do {
        bdd_i = create_bdd_variable ();
        put_on_heap (heap, bdd_i);
    }
    while (heap != empty) do {
        bdd = get_smallest_bdd (heap);
        v   = get_vertex_from_bdd (bdd);
        /* check if handled before */
        if (get_bdd_from_vertex (v)) continue;
        store_bdd_at_vertex (v, bdd);
        for all fanout vertices v_out of v do {
            bdd_left  = get_bdd_from_vertex (v_out ->left);
            bdd_right = get_bdd_from_vertex (v_out ->right);
            bdd_res   = bdd_and (bdd_left, bdd_right);
            I_res     = get_vertex_from_bdd (bdd_res);
            if v_res {
                merge_vertices (v_res, v_out);
                if (v_1 == v_2)        return equal;
                if (v_1 == NOT(v_2))   return not_equal;
            }
            else {
                store_vertex_at_bdd (bdd_res, v_out);
            }
            put_on_heap (heap, bdd_res);
        }
    }
    return undecided;
}
```

Algorithm For Heap-based BDD Processing

For further clarification, procedure "put_on_heap" stores a BDD on the heap only if its size is smaller than the given limit, otherwise the BDD node is freed and disregarded. The notations $v_{out} \rightarrow left$ and $v_{out} \rightarrow right$ refer to the two incoming operands of vertex v. Procedures "get_bdd_from_vertex" and "get_vertex_from_bdd" provide cross-references between BDD nodes and the corresponding circuit graph vertices, and handle inverted edges and inverted BDD nodes internally.

Figure 1A:
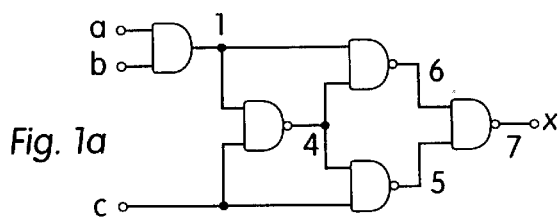
FIGS. 1a and 1b are examples of two structurally different and functionally identical circuits for demonstrating the method according to the invention.
Figure 1B:
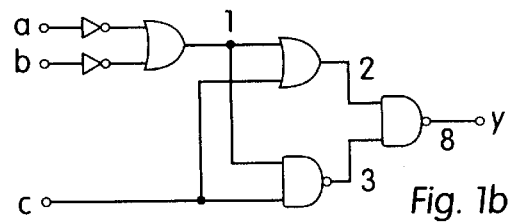
Figure 2A:
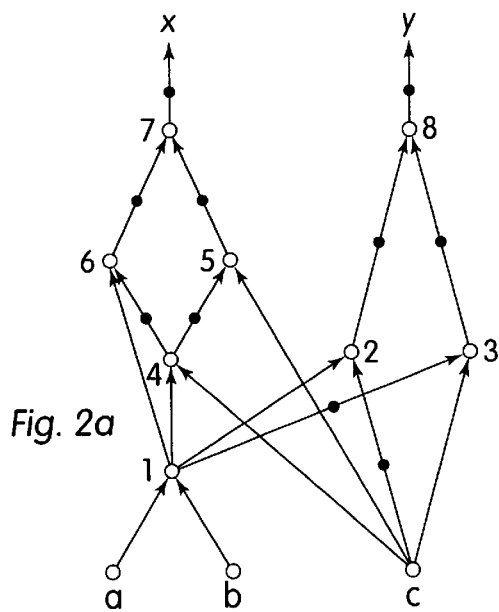
FIG. 2a is a circuit graph corresponding to the circuits of FIGS. 1a and 1b.

FIGS. 2a–2d illustrate the construction of the circuit graph for a simple example. The two circuits in FIGS. 1a and 1b are structurally different but implement the same function. FIG. 2a shows the result of the graph construction after the first phase. The vertices of the graphs represent AND functions. Similarly, the filled dots at the edges symbolize the inverters. Note, that the functions a∧b of the first circuit and $\overline{a} \vee \overline{b}$ of the second circuit are identified as structurally equivalent (modulo inversion) and mapped to the same vertex 1 in the graph model. No other parts of the two circuits could be merged by the initial hashing process. After graph construction is complete, the equivalence check is performed by the algorithm for equivalence checking described previously.

The overall idea of the algorithm is to merge the subgraphs of the two output vertices using BDDs to prove functional equivalence of intermediate vertices. The BDD propagation is controlled by a sorted heap. First, for each primary input a BDD variable is created and entered onto the heap. Then an iterative process removes the smallest BDD from the heap, processes the Boolean operation for the immediate fanout of the corresponding circuit graph vertex, and re-enters the resulting BDDs onto the heap. Functionally equivalent vertices found during that process are immediately merged and the subsequent parts of the circuit graph are rehashed by the routine "merge_vertices". The rehashing is applied in depth-first order starting from the merged vertex toward the primary outputs and stops if no further reconvergency is found.

Figure 2B:
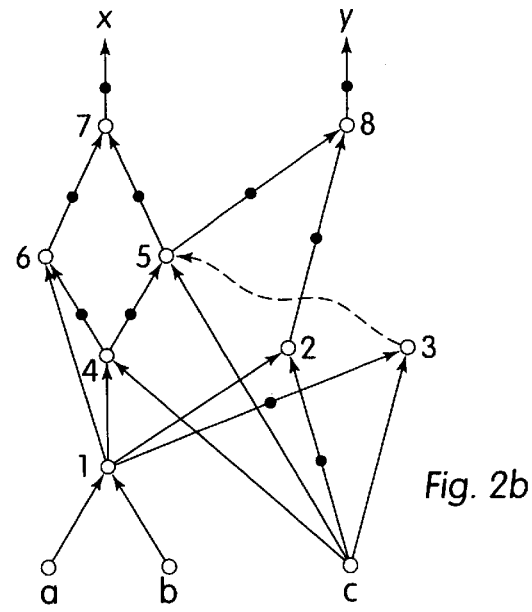
FIGS. 2b–2d are graphical representations of the application of the equivalence checking algorithm to the circuit graph of FIG. 2a according to the present invention.
Figure 2C:
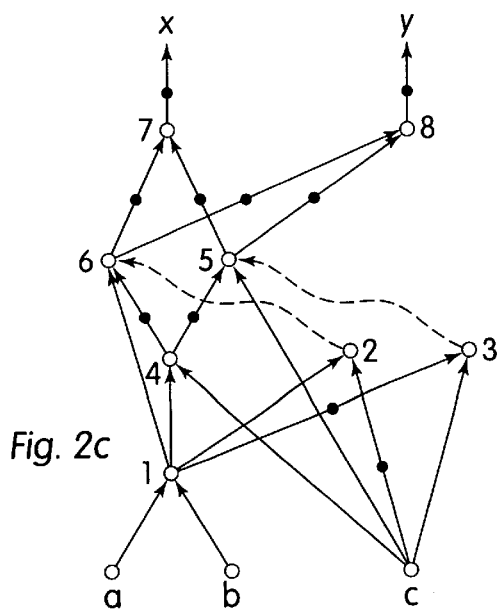
Figure 2D:
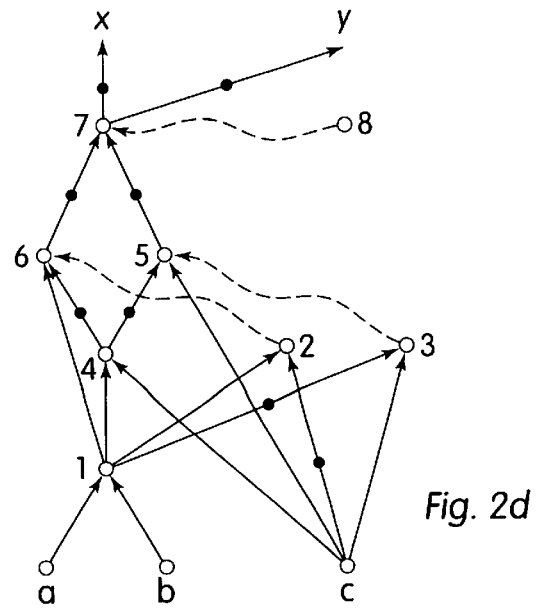

FIGS. 2b–2d illustrate the results of the equivalence checking algorithm for the circuit graph of FIG. 2a. It is assumed that the BDDs are processed in the order of their corresponding vertices 1, 2, 3, 4, 5, and 6. The first four iterations create the BDDs for vertices 1, 2, 3, and 4. In the next iteration, the computed BDD for vertex 5 points to the functionally equivalent vertex 3. Therefore, vertices 5 and 3 are merged as indicated in FIG. 2b. The next figure (2c) shows the graph after vertex 6 has been processed and merged with vertex 2. The subsequent forward rehashing identifies vertices 7 and 8 as structurally identical and merges them which yields the graph structure of FIG. 2d. At this point the equivalence of both outputs is proven and the algorithm terminates without building BDDs for the last level of the two circuits.

The algorithm for heap-based BDD processing handles BDDs up to a maximum size only. The maximum size is based on available memory. Therefore, the heap processing potentially terminates without succeeding to merge the two output vertices, even if they are functionally equivalent. In order to exploit the structural similarities found in the previous phase, all vertices that have been merged are now used as cutpoints to inject new BDD variables onto the heap.

The cut level c_level(v) of circuit graph vertex v is defined as follows:

$$c\_level(v) = \begin{cases} 0 & \text{if } v \text{ is primary input} \\ max(c\_level(v\text{->}left), c\_level(v\text{->}right))+1 & \text{if } v \text{ is cut point} \\ max(c\_level(v\text{->}left), c\_level(v\text{->}right)) & \text{otherwise.} \end{cases}$$

All cutpoints with identical cut levels are assigned to a cut frontier which initiates an independent layer of BDD propagation through the circuit graph. Since the layers generally overlap, this scheme effectively generates multiple BDDs for each graph vertex. Intuitively, this diversity increases the chance of merging subgraphs and decreases the likelihood of false negatives.

An extended version of the algorithm for heap-based BDD processing is used to implement the multi-layer propagation of BDDs. As shown in the algorithm for heap-based propagation with cut frontiers, the additions mainly involve a level-oriented handling of BDDs. The procedure "get_bdd_from_vertex" returns the BDD stored for the specified level at the vertex. If the given level exceeds the cut level of the vertex, the BDD of the cut level itself is taken. This algorithm is called repeatedly until no new cut frontiers are found, or equivalence of the two outputs is proven.

```
Algorithm Check_Equivalence_with_Cuts (v_1, v_2) {
    for all vertices c that have been merged before do {
        bdd_c   = create_bdd variable ();
        level_c   c_level (c);
        store_level_at_bdd (bdd_c, level_c);
        put_on_heap (heap, bdd_c);
    }
    while (heap != empty) do {
        bdd = get_smallest_bdd (heap);
        v   = get_vertex_from_bdd (bdd);
```

```
            level      = get_level_from_bdd (bdd);
            if (get_bdd_from_vertex (v)) continue;
            store_bdd_at_vertex (v, bdd, level);
            for all fanout vertices v_out of v do {
                    bdd_left   = get_bdd_from_vertex (v_out -> left, level);
                    bdd_right  = get_bdd_from_vertex (v_out ->right, level);
                    bdd_res    = bdd_and (bdd_left, bdd_right);
                    v_res      = get_vertex_from_bdd (bdd_res);
                    if (v_res ) {
                            merge_vertices (v_res, v_out);
                            if (v_1 == v_2)            return equal;
                            if (v_1 == NOT(v_2))       return not_equal;
                    }
                    else {
                            store_vertex_at_bdd (bdd_res, v_res);
                            store_level_at_bdd (bdd_res, level);
                    }
                    put_on_heap (heap, bdd_res);
            }
    }
    return undecided;
}
```

Heap-based BDD Propagation With Cut Frontiers

Elimination of False Negatives

As discussed previously, the application of cutpoints can potentially introduce false negative verification results. This occurs if the insertion of cut frontiers produces different BDDs for two functionally equivalent output vertices. To prove equivalence for those cases, the cutpoint variables that support these BDDs need to be resubstituted by their original driving functions. As discussed, this resubstitution process potentially results in a blow-up of the BDDs. In order to fully explore all BDD pairs constructed for the two outputs without running into memory explosion, the elimination process is also controlled by a heap.

```
Algorithm Eliminate_False_Negatives (v_1, v_2) {
    for level = 0 to c_level (v_1) do {
            bdd = get_dd_from_vertex (v_1, level);
            put_on_heap (compose_heap, bdd);
    }
    for level = 0 to c_level (v_2) do {
            bdd = get_bdd_from_vertex (v_2, level);
            put_on_heap (compose_heap, bdd);
    }
    while (compose_heap != empty) do {
            bdd      = get_smallest_bdd (compose_heap);
            v        = get_vertex_from_bdd (bdd);
            bdd_var  = get_cutvar_from_bdd (bdd);
            if (bdd_var) {
                    vvar       = get_vertex_from_bdd (bdd_var);
                    level      = c_level (v_var);
                    bdd_func   = get_bdd_from_vertex (v_var, level-1);
                    bdd_res    = bdd_compose (bdd, bdd_var, bdd_func);
                    v_res      = get_vertex_from_bdd (bdd_res);
                    if (v_res) {
                            merge_vertices (v_res, v);
                            if (v_1 == v_2)            return equal;
                            if (v_1 == NOT(v_2))       return not_equal;
                    }
                    else {
                            store_vertex_at_bdd (bdd_res, v);
                            put_on_heap (compose_heap, bdd_res);
                    }
            }
    }
    return undecided;
}
```

Algorithm to Eliminate False Negatives

In the algorithm to eliminate false negatives, first the heap is initialized with all BDDs computed for the output vertices. Then, in each iteration, the BDD with the smallest size is taken and its topmost cut variable resubstituted by its corresponding original driving function. The resulting BDD is then checked for a functionally equivalent vertex that has been processed before. If found, both vertices are merged and the subsequent parts of the circuit graph are rehashed. Otherwise, if the size of the resulting BDD is smaller than the given limit, it is reentered onto the heap for further processing.

Implementation Details

The verification technique of the invention can be implemented in the verification tool entitled Verity which is a formal verification program for custom CMOS circuits. See, A. Kuehlmann, A Srinivasan, and D. P. LaPotin, "*Verity—a formal verification program for custom CMOS circuits,*" *IBM Journal of Research and Development,* vol. 39, pp. 149–165, January/March 1995. Verity is based on a number of Boolean reasoning engines, each of which is specialized on different types of designs. The overall verification scenario engages one engine at a time to solve as many outstanding problems as possible. If a problem cannot be solved due to time or memory limitations, it gets automatically passed to the next engine.

The method of the invention is embedded in a Verity scenario which starts with randomly simulating 32 patterns to uncover the majority of miscomparing outputs quickly, and to simulate trivial functions exhaustively. Then the described engine is applied in several iterations with increasing limits for the BDD size. After that, the remaining problems are forwarded to other BDD- and ATPG-based reasoning engines.

In practice, a verification approach based on multiple engines is quite powerful since each engine can be tuned for a specific class of designs. For example, if the two designs to be compared are very similar, the presented engine works highly efficient using a small limit on the BDD size. Contrarily, with larger limits, the engine can handle design pairs with significant structural differences, but also uses more time to build the layered BDD representation.

Practical Experiments

The first two experiments were conducted to validate the assumptions that many industrial circuits are structurally similar and that the presented method can effectively exploit this property. Both tests are based on a suite of approximately 300 circuits taken from several PowerPC, System/390, and AS/400 microprocessor designs. These circuits cover the whole complexity spectrum from simple data-path components to full chips.

Figure 3:
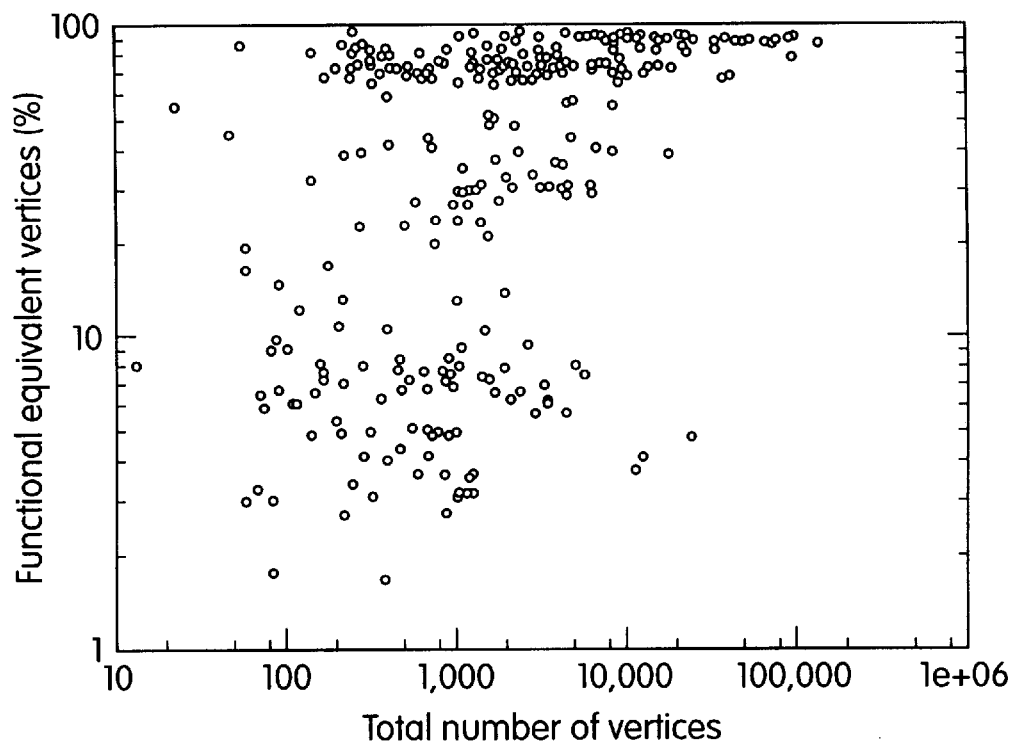
FIG. 3 is a graphical representation of a first experiment implementing the method according to the invention.

To measure the structural similarity of the two designs to be compared, the number of vertices in the circuit graph representations were counted which have functionally equivalent counterparts. The numbers include all hash table matches during graph construction, the merge operations during BDD propagation, and the matches during the following forward rehashing step. Note that the effect of constant folding is not included, since it is highly dependent on the implementation of the switch-level extraction algorithm. The results for the 300 designs are shown in FIG. 3. As shown, for about 80% of the circuits, more than 80% of the graph vertices did find an equivalent counterpart vertex. This attests to the fact that equivalence checking in practice can and should heavily exploit structural similarity.

Figure 4:
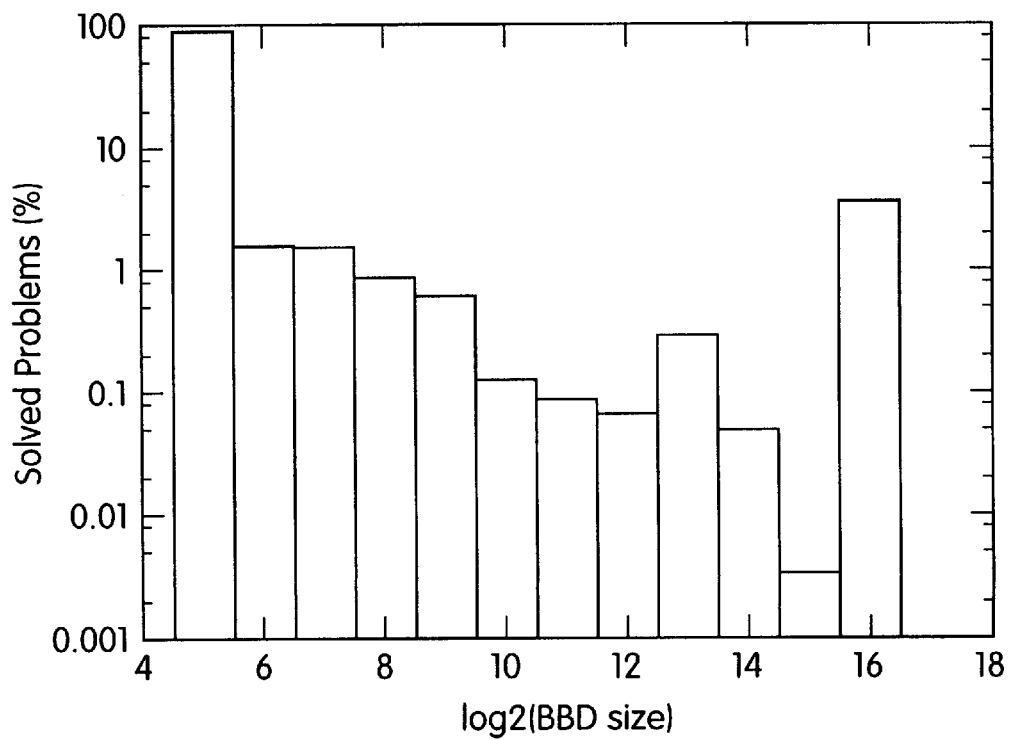
FIG. 4 is a graphical representation of a second experiment implementing the method according to the invention.

The second experiment demonstrates that the presented approach can effectively reduce the size of the BDDs needed to compare the two circuit representations. For the mentioned test suite, the number of verification problems that could be solved with a given BDD size limit were counted. The results are displayed in the histogram of FIG. 4. Interestingly, 91% of all problems could be solved with a BDD limitation of $2^5$ nodes, whereas only 3.8% of the problems needed BDDs with more than $2^{15}$ nodes. Thus, the method of the present invention which combines structural vertex hashing with the heap controlled BDD propagation can efficiently exploit the inherent similarity of the designs.

Next, the performance of the presented technique was measured for a selected set of designs including the notorious ISCAS benchmark circuits (redundant against the non-redundant version) and a number of IBM internal circuits. The tests were based on the verification tool Verity and performed on a RS/6000 workstation model 390.

The results for the verification runs are shown in Table 1. The second and third column report the design complexity in terms of the number of inputs, outputs, gates, and transistors. The next column shows the number of functional comparisons and consistency checks performed by Verity. Note, that for each output/register Verity applies a separate comparison for the 1-function and 0-function. The consistency checks include all tests of internal nets for floating conditions or collisions. The next two columns report the CPU time and memory usage. The runtime comprises the entire verification run including reading, preprocessing, and post-processing of the design data. Similarly, the memory figures are measured for the entire process and include the memory storage for the models and other administrative services in Verity.

TABLE 1

Verification performance for selected circuits

| Design | Inputs/ Outputs | Gates/ Transistors | Comparisons/ Checks | CPU (sec) | Memory (MB) |
|---|---|---|---|---|---|
| C1355 | 4/32 | 1940/— | 64/4008 | 24.3 | 2.9 |
| C1908 | 33/25 | 2536/— | 50/5730 | 6.2 | 2.9 |
| C2670 | 233/139 | 2637/— | 278/6324 | 3.3 | 4.0 |
| C3540 | 50/22 | 4113/— | 44/9140 | 29.21 | 7.4 |
| C432 | 36/7 | 618/— | 14/1236 | 11.3 | 8.5 |
| C499 | 41/32 | 484/— | 64/968 | 16.7 | 2.4 |
| C5315 | 178/123 | 6213/— | 246/13714 | 46.3 | 15.7 |
| C6288 | 32/32 | 9036/— | 64/18072 | 9.59 | 6.7 |
| C7552 | 207/108 | 8916/— | 216/20050 | 14.5 | 6.7 |
| D9000 | 202615/84354 | —/— | 406068/3109078 | 13922.4 | 670.3 |
| D9001 | 47370/5802 | 1024763/14460 | 93236/687792 | 1785.7 | 552.7 |
| D9002 | 2383/3325 | 28432/57806 | 7316/86066 | 3437.7 | 83.1 |
| D9003 | 1519/482 | 29807/— | 3108/44765 | 1760.9 | 31.8 |
| D9004 | 11661/2398 | 51759/— | 23838/100204 | 572.0 | 47.8 |
| D9005 | 209/84 | 1923/7874 | 168/8192 | 24.0 | 14.0 |
| D9006 | 133/247 | 3677/16672 | 594/12130 | 136.2 | 25.1 |

The multi-layer approach of the invention is a significant contributing factor to the robustness with respect to the sensitivity to false negatives, and increases the runtime of the presented technique only linearly compared to the single layer approach. The Verity approach requires significant administrative overhead and additional effort and cost to propagate multiple BDD layers.

The following seven designs are taken from IBM microprocessors: D9000 is a large microprocessor chip where all functional components are black-boxed. This design exercises an extreme verification case with no logic but a very large number of verification problems. As shown, the runtime and memory consumption for this case is reasonable and expected to grow linearly with larger chips. D9001 is the flat design of a complete microprocessor. The two representations to be compared are modeled on gate- and transistor-level and are structurally very similar. In this case, the graph hashing solves the majority of the verification problems, where slight irregularities are effectively "bridged" by the BDD propagation. D9002 is a multiplier circuit for which the gate-level representation is compared against the custom-designed transistor-level implementation. The larger structural difference is clearly reflected in a larger runtime effort to compare them. D9003 and D9004 are two designs which previously could not be verified without manually partitioning them into smaller pieces. Using the method of the invention, Verity can handle these circuits for the first time automatically. The last two designs are typical data-path units.

The proposed engine greatly extends the class of designs which can be handled automatically. For example, with the exception of D9000 none of the industrial designs of Table 1 could be verified in a reasonable amount of time (i.e., less than 1 day) using a BDD engine only.

Overall, the presented approach performs efficiently for a wide variety of designs with some degree of structural similarity. Compared to a pure BDD approach, many practical designs can now be verified without manual partitioning, and others can be run significantly faster. The combination of the presented technique with alternative verification engines specialized in other classes of designs (e.g., Verity) results in a powerful practical verification tool which is robust and efficient for most application.

We claim:

1. A method for equivalence checking of combinational circuits comprising the steps of:

converting at least two circuits to be compared into an AND/INVERTER circuit graph;

identifying and merging structurally equivalent parts of the circuit graph by vertex hashing;

processing binary decision diagrams (BDDs) to prove the functional equivalence of circuit graph vertices not identified by said vertex hashing; and outputting an equivalence status of the compared circuits.

2. The method according to claim 1, wherein said step of applying vertex hashing is performed during said step of converting the circuits to be compared.

3. The method according to claim 1, wherein the equivalence status output is either a confirmation of circuit equivalence, or a cannot decide status.

4. The method according to claim 1, wherein said step of processing BDDs further comprises the steps of:
- creating a BDD for each primary input;
- entering the created BDDs onto a heap;
- removing a smallest BDD from the heap;
- processing a Boolean operation for an immediate fanout of the corresponding circuit graph vertex; and
- re-entering resulting BDDs onto the heap, wherein said removing and re-entering steps and said step of processing a Boolean operation are performed iteratively.

5. The method according to claim 4, further comprising the steps of:
- merging functionally equivalent vertices; and
- re-hashing the subsequent parts of the circuit graph.

6. The method according to claim 5, further comprising the steps of:
- identifying the merged vertices as cutpoint variables;
- assigning a cut level to the identified cutpoint variables;
- assigning a cut frontier to all cutpoints with identical cut levels; and
- initiating an independent layer of BDD propagation through the circuit graph from each cut frontier.

7. The method according to claim 5, wherein said step of rehashing is applied in depth-first order starting from the merged vertex toward the primary outputs, said rehashing stopping when no further convergency is found.

8. The method according to claim 6, further comprising the step of eliminating false negatives at output vertices for processed BDDs.

9. The method according to claim 8, wherein said step of eliminating false negatives comprises the steps of:
- initializing a heap with all BDDs processed for the output vertices;
- identifying the BDD with the smallest size;
- re-substituting a topmost cutpoint variable in the identified BDD with its corresponding original driving function; and
- checking the resulting BDD for a functionally equivalent vertex previously processed.

10. The method according to claim 9, wherein said step of checking further comprises the steps of:
- merging any identified previously processed functionally equivalent vertex with the vertex being compared; and
- rehashing the subsequent parts of the circuit graph.

11. The method according to claim 9, wherein said step of checking further comprises the steps of:
- determining if the size of the resulting BDD; and
- re-entering the BDD onto the heap when it is smaller than a predetermined limit.

12. A method for equivalence checking of combinational circuits comprising the steps of:
- converting at least two circuits to be compared into an AND/INVERTER circuit graph;
- applying vertex hashing to the circuits to be compared during said step of converting to identify and merge structurally equivalent parts of the circuit graph;
- processing binary decision diagrams (BDDs) to prove the functional equivalence of the circuit graph vertices not identified by said vertex hashing; and
- limiting the size of the processed BDDs;
- eliminating identified false negatives in the output vertices of the processed BDDs; and
- outputting an equivalence status of the compared circuits.

13. The method according to claim 1, wherein said step of processing BDDs further comprises the steps of:
- creating a BDD for each primary input;
- entering the created BDDs onto a heap;
- removing a smallest BDD from the heap;
- processing a Boolean operation for an immediate fanout of the corresponding circuit graph vertex; and
- re-entering resulting BDDs onto the heap;
- merging functionally equivalent vertices; and
- re-hashing the subsequent parts of the circuit graph, wherein said removing re-entering, merging, and re-hashing steps and said step of processing a Boolean operation are performed iteratively.

14. The method according to claim 12, wherein said step of processing BDDs further comprises the steps of:
- creating a BDD for each primary input;
- entering the created BDDs onto a heap;
- removing a smallest BDD from the heap;
- processing a Boolean operation for an immediate fanout of the corresponding circuit graph vertex;
- re-entering resulting BDDs onto the heap,
- merging functionally equivalent vertices; and
- re-hashing the subsequent parts of the circuit graph.

15. The method according to claim 14, further comprising the steps of:
- identifying the merged vertices as cutpoint variables;
- assigning a cut level to the identified cutpoint variables;
- assigning a cut frontier to all cutpoints with identical cut levels; and
- initiating an independent layer of BDD propagation through the circuit graph from each cut frontier.

16. The method according to claim 15, wherein said step of eliminating false negative comprises the steps of:
- initializing a heap with all BDDs processed for the output vertices;
- identifying the BDD with the smallest size;
- re-substituting a topmost cutpoint variable in the identified BDD with its corresponding original driving function;
- checking the resulting BDD for a functionally equivalent vertex previously processed.
- merging any identified previously processed functionally equivalent vertex with the vertex being compared; and
- rehashing the subsequent parts of the circuit graph.

17. A method for equivalence checking of combinational circuits, comprising the steps of:
- converting at least two circuits to be compared into an AND/INVERTER circuit graph;
- identifying and merging structurally equivalent parts of the circuit graph by vertex hashing;
- processing binary decision diagrams (BDDs) to identify functionally identical vertices of the circuit graph not identified by said vertex hashing, using a sorted heap to control propagation of the BDDs; and
- outputting an equivalence status of the compared circuit.

18. The method according to claim 1, wherein said step of processing BDDs further comprises the steps of:
- creating a BDD for each primary input;
- entering the created BDDs onto a heap;
- removing a smallest BDD from the heap;
- processing a Boolean operation for an immediate fanout of the corresponding circuit graph vertex; and re-entering resulting BDDs onto the heap, wherein said removing and re-entering steps and said step of processing a Boolean operation are performed iteratively.

19. The method according to claim 1, further comprising the step of eliminating false negatives at output vertices for processed BDDs.

20. The method according to claim 1, wherein said step of eliminating false negatives comprises the steps of:

initializing a heap with all BDDs processed for the output vertices;

identifying the BDD with the smallest size;

re-substituting a topmost cutpoint variable in the identified BDD with its corresponding original driving function; and checking the resulting BDD for a functionally equivalent vertex previously processed.

* * * * *